(12) United States Patent
Sugiura

(10) Patent No.: US 7,111,513 B2
(45) Date of Patent: Sep. 26, 2006

(54) PHYSICAL QUANTITY SENSOR HAVING PROTRUSION AND METHOD FOR MANUFACTURING THE SAME

(75) Inventor: Makiko Sugiura, Hekinan (JP)

(73) Assignee: Denso Corporation, Kariya-city (JP)

( * ) Notice: Subject to any disclaimer, the term of this patent is extended or adjusted under 35 U.S.C. 154(b) by 158 days.

(21) Appl. No.: 10/795,427

(22) Filed: Mar. 9, 2004

(65) Prior Publication Data

US 2004/0187592 A1    Sep. 30, 2004

(30) Foreign Application Priority Data

Mar. 28, 2003    (JP)    ............... 2003-090877

(51) Int. Cl.
G01P 15/125    (2006.01)
G01P 3/00    (2006.01)
G01C 19/00    (2006.01)

(52) U.S. Cl. ............... 73/514.32; 73/504.12; 73/504.14

(58) Field of Classification Search ............. 73/514.32, 73/514.29, 504.12, 504.04, 504.14, 514.36; 361/280, 283.1, 283.3
See application file for complete search history.

(56) References Cited

U.S. PATENT DOCUMENTS

| | | | | |
|---|---|---|---|---|
| 5,679,436 A * | 10/1997 | Zhao | ............ | 428/141 |
| 5,721,377 A * | 2/1998 | Kurle et al. | ............ | 73/504.12 |
| 5,939,171 A * | 8/1999 | Biebl | ............ | 428/141 |
| 6,065,341 A * | 5/2000 | Ishio et al. | ............ | 73/514.32 |
| 6,105,428 A * | 8/2000 | Schmiesing et al. | ...... | 73/514.32 |
| 6,151,966 A * | 11/2000 | Sakai et al. | ............ | 73/514.32 |
| 6,494,096 B1 * | 12/2002 | Sakai et al. | ............ | 73/514.32 |
| 6,528,724 B1 * | 3/2003 | Yoshida et al. | ............ | 174/52.4 |
| 6,568,269 B1 * | 5/2003 | Nakabayashi | ............ | 73/514.32 |
| 6,694,814 B1 * | 2/2004 | Ishio | ............ | 73/514.32 |
| 6,736,008 B1 * | 5/2004 | Kumagai et al. | ........ | 73/504.14 |
| 2004/0025591 A1 * | 2/2004 | Yoshikawa et al. | ...... | 73/514.32 |

FOREIGN PATENT DOCUMENTS

| | | |
|---|---|---|
| JP | A-10-135488 | 5/1998 |
| JP | A-2001-91262 | 4/2001 |
| JP | A-2001-153882 | 6/2001 |

\* cited by examiner

*Primary Examiner*—Helen Kwok
(74) *Attorney, Agent, or Firm*—Posz Law Group, PLC

(57) ABSTRACT

A physical quantity sensor detects a physical quantity. The sensor includes a movable portion having a bottom and a protrusion disposed on the bottom of the movable portion. The protrusion is provided without adding a manufacturing process, so that a manufacturing cost is reduced. Preferably, the protrusion is provided by a remaining portion, which remains without being etched when the movable portion is prepared by etching.

7 Claims, 4 Drawing Sheets

PHYSICAL QUANTITY SENSOR HAVING PROTRUSION AND METHOD FOR MANUFACTURING THE SAME

CROSS REFERENCE TO RELATED APPLICATION

This application is based on Japanese Patent Application No. 2003-90877 filed on Mar. 28, 2003, the disclosure of which is incorporated herein by reference.

FIELD OF THE INVENTION

The present invention relates to a physical quantity sensor having a protrusion and a method for manufacturing the same.

BACKGROUND OF THE INVENTION

A physical quantity sensor such as an acceleration sensor for detecting acceleration on the basis of a capacitance between a fixed electrode and a movable electrode is disclosed in Japanese Unexamined Patent Application Publication No. 2001-153882. The sensor is a capacitance type acceleration sensor, and the sensor is a foreside processing acceleration sensor, which is provided by processing a foreside surface of a substrate.

In the foreside processing acceleration sensor, a distance between movable portions and a substrate is narrow compared with a backside processing acceleration sensor, which is provided by processing a backside surface of the substrate. The movable portions are, for example, the movable electrode, a massive portion and a spring, which are movable in accordance with the acceleration. Therefore, when the excess acceleration is applied to the sensor, or when moisture or electrostatic force affects the sensor, the movable portions may adhere to the substrate in a case where the movable portions approach the substrate.

Therefore, the sensor includes a protrusion disposed on the substrate to prevent the movable portions from adhering to the substrate. However, an additional process for forming the protrusion on the substrate is necessitated. For example, a film deposition process and an etching process are necessitated to form the protrusion. Therefore, a manufacturing cost is increased.

SUMMARY OF THE INVENTION

In view of the above-mentioned problems, it is an object of the present invention to provide a physical quantity sensor having a protrusion without adding a manufacturing process.

Further, it is another object of the present invention to provide a method for manufacturing a physical quantity sensor having a protrusion.

A physical quantity sensor detects a physical quantity. The sensor includes a movable portion having a bottom and a protrusion disposed on the bottom of the movable portion. The protrusion is provided without adding a manufacturing process, so that a manufacturing cost is reduced.

Preferably, the protrusion is provided by a remaining portion, which remains without being etched when the movable portion is prepared by etching. More preferably, the sensor further includes a substrate for supporting the movable portion movably. The movable portion is disposed over the substrate at a predetermined distance therebetween. The protrusion protrudes toward the substrate so that the protrusion prevents the movable portion from adhering to the substrate. The movable portion includes a part, which has a wide width compared with other parts of the movable portion. The protrusion is disposed on the bottom of the part of the movable portion. The protrusion is formed simultaneously together with the movable portion in a case where the movable portion is removed from the substrate by etching. Furthermore preferably, the part of the movable portion remains in a case where the movable portion is formed by isotropically etching so that the protrusion is provided by a remaining portion of the part of the movable portion.

Preferably, the movable portion includes a part, which has a wide width compared with other parts of the movable portion. The protrusion is disposed on the bottom of the part of the movable portion. More preferably, the part of the movable portion is provided by a convexity extending to a movable direction of the movable portion.

Preferably, the sensor further includes a fixed electrode. The movable portion includes a movable electrode. The movable electrode faces the fixed electrode so that a capacitor having a capacitance is provided between the movable and fixed electrodes. The physical quantity is detectable on the basis of the capacitance. More preferably, the fixed electrode is supported on the substrate, and the movable portion is movably supported on the substrate. The convexity protrudes from the movable electrode toward the fixed electrode for preventing the movable electrode from adhering to the fixed electrode.

Further, a method for manufacturing a physical quantity sensor for detecting a physical quantity is provided. The method includes the steps of laminating a second substrate on a first substrate; firstly etching the second substrate so that a groove is formed between a movable-portion-to-be-formed region and the second substrate, wherein the groove includes a part, which is narrow compared with other portions of the groove, so that the movable-portion-to-be-formed region includes a convexity; and secondary etching the second substrate so that a movable portion with the convexity is separated from the first substrate and a protrusion is formed on a bottom of the convexity.

In the sensor manufactured by the above method, the protrusion is provided without adding a manufacturing process, so that a manufacturing cost is reduced.

Preferably, the protrusion protrudes from the convexity of the movable portion toward the first substrate so that the protrusion prevents the movable portion from adhering to the substrate. The protrusion is provided by a remaining portion of the second substrate, which is remained in the step of secondary etching the second substrate.

Preferably, a fixed electrode is formed in the steps of firstly etching and secondary etching. The movable portion includes a movable electrode. The movable electrode faces the fixed electrode so that a capacitor having a capacitance is provided between the movable and fixed electrodes. The physical quantity is detectable on the basis of the capacitance.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENT

The inventor preliminarily manufactures a physical quantity sensor as a comparison. The sensor is, for example, used for an acceleration sensor for detecting acceleration on the basis of a capacitance between a fixed electrode and a movable electrode. Therefore, the sensor is a capacitance type acceleration sensor.

Figure 5:
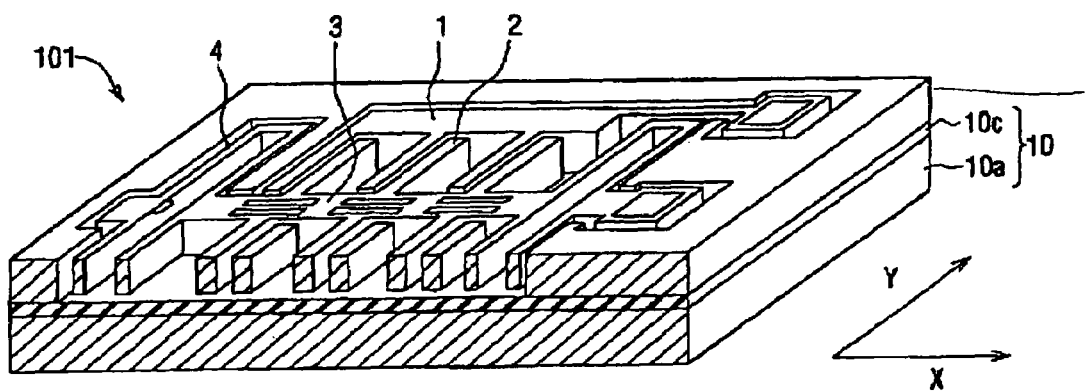
FIG. 5 is a perspective view showing a comparison physical quantity sensor as a comparison, according to the preferred embodiment.
Figure 6:
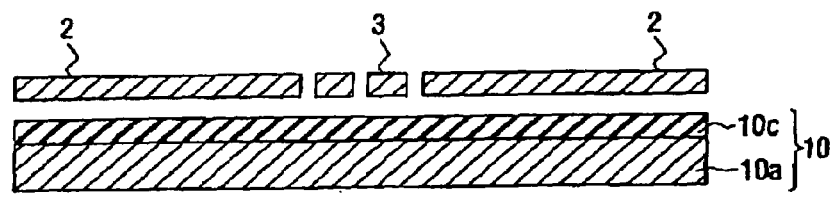
FIG. 6 is a cross sectional view showing the comparison sensor, according to the preferred embodiment.

There are two types of the physical quantity sensor. One is a backside processing acceleration sensor, and the other is a foreside processing acceleration sensor. The chip size of the foreside processing acceleration sensor is smaller than that of the backside processing acceleration sensor. FIGS. 5 and 6 show the foreside processing acceleration sensor 101 formed as a comparison.

The sensor 101 includes a semiconductor substrate 10 formed of a silicon substrate 10a and an oxide film 10c made of silicon oxide. A groove is formed in the substrate 10 so that multiple fixed electrodes 1 and multiple movable electrodes 2 are formed. The fixed electrodes 1 face the movable electrodes 2 in X direction (i.e., an acceleration detection direction) so that they provide a capacitor having a capacitance. The movable electrodes 2 are provided by multiple pairs of comb-tooth electrodes, which extend to Y direction. The Y direction is perpendicular to the X direction. A massive portion 3 extends to the X direction. The movable electrodes 2 protrude from the massive electrode 3. A pair of springs 4 is disposed on both ends of the massive electrode 3. The spring 4 is movable in the X direction, and includes a pair of beams having a loop.

When the acceleration in the X direction is applied to the sensor 101, the spring 4 is displaced in the X direction. Therefore, a distance between the fixed electrode 1 and the movable electrode 2 is changed, so that the capacitance between them is also changed. The capacitance change derived from the movable electrode 2 is converted to a voltage. Thus, the acceleration is detected.

In the foreside processing acceleration sensor 101, a distance between movable portions and the substrate 10 is narrow compared with the backside processing acceleration sensor. The movable portions are, for example, the movable electrode 2, the massive portion 3 and the spring 4, which are movable in accordance with the acceleration. The distance is, for example, a few microns. Therefore, when the excess acceleration is applied to the sensor 101, or when moisture or electrostatic force affects the sensor 101, the movable portions may adhere to the substrate 10 in a case where the movable portions approach the substrate 10.

Figure 1:
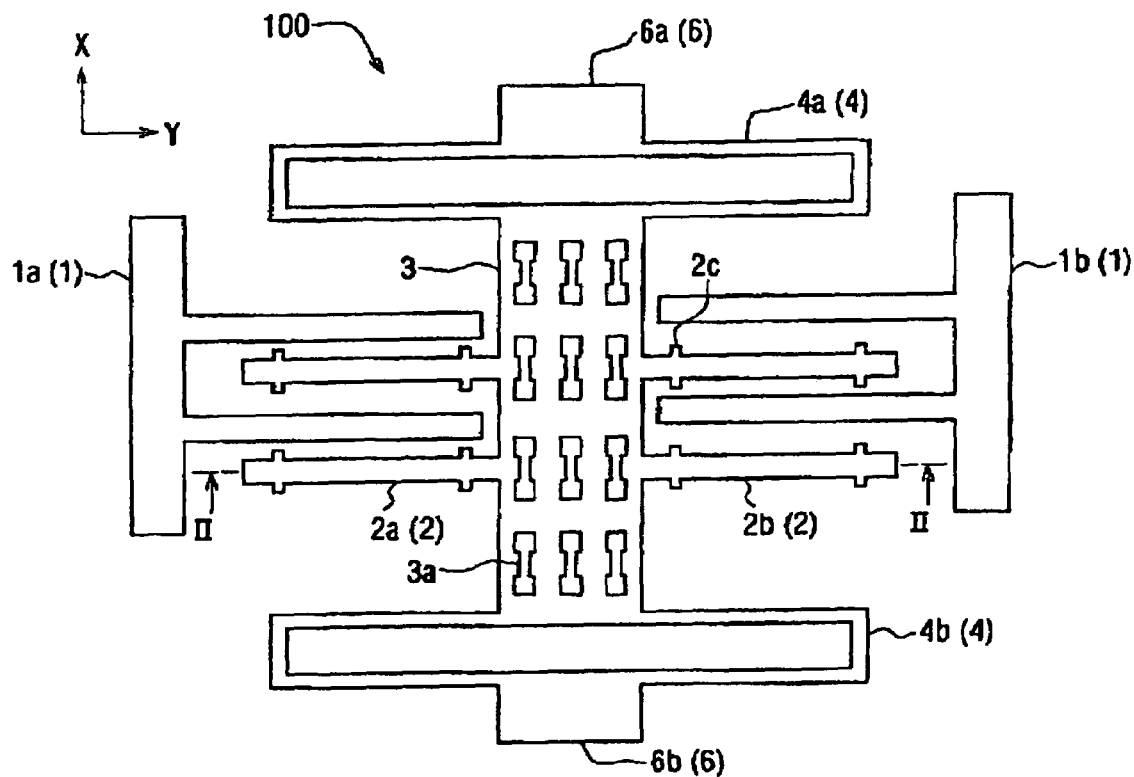
FIG. 1 is a plan view showing a physical quantity sensor according to a preferred embodiment of the present invention.
Figure 2:
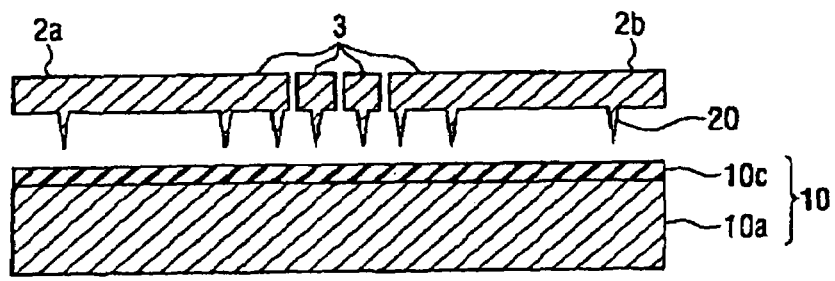
FIG. 2 is a cross sectional view showing the sensor taken along line II—II in FIG. 1.

In view of the above comparison, a physical quantity sensor according to a preferred embodiment of the present invention is provided. The sensor is a capacitance type acceleration sensor and a foreside processing acceleration sensor. The sensor 100 is shown in FIGS. 1 and 2. The sensor 100 has movable portions such as a massive portion 3 and multiple movable electrodes 2. The massive portion 3 extends to the X direction, which is an acceleration detection direction. The movable electrodes 2 protrude from the massive portion 3 in the Y direction, which is perpendicular to the X direction. The movable electrodes 2 are parallel each other. The movable electrodes 2 include a left side movable electrode 2a and a right side movable electrode 2b. Springs 4 are disposed on both ends of the massive portion 3 in the X direction. The springs 4 are composed of an upper side spring 4a and a lower side spring 4b. The springs 4 are movable in accordance with the acceleration. The springs 4 are supported on a semiconductor substrate 10 made of silicon through anchors 6. The anchors 6 are composed of an upper side anchor 6a and a lower side anchor 6b. The fixed electrodes 1 include a left side fixed electrode 1a and a right side fixed electrode 1b. The left side fixed electrode 1a faces the left side movable electrode 2a so that a pair of fixed and movable electrodes 1a, 2a is formed on the substrate 10. The right side fixed electrode 1b faces the right side movable electrode 2b so that another pair of fixed and movable electrodes 1b, 2b is formed on the substrate 10.

When the acceleration is applied to the sensor 100 in the X direction, the spring 4 is displaced. Therefore, a capacitance between the movable and fixed electrodes 1, 2 is changed. The capacitance change is converted to a voltage by an outer circuit such as a switched capacitor circuit (i.e., SC circuit). Thus, the voltage is outputted so that the sensor detects the acceleration as the output voltage.

The sensor 100 further includes multiple protrusions 20 for preventing the movable portions from adhering to the substrate 10. These protrusions 20 are formed on the movable portions without increasing an additional manufacturing process. To form the protrusions 20, the movable portions have a predetermined pattern as follows. Specifically, the movable portions include partially wide portions having the protrusions disposed on the bottom of wide portions. For example, the movable electrode 2 includes a convexity 2c, which protrudes in the X direction. The massive portion 3 includes a convexity 3a, which protrudes in the Y direction. The protrusion 20 is formed on the bottom of the convexity 2c, 3a of both of the movable electrode 2 and the fixed electrode 3. Here, the protrusion 20 and the convexities 2c, 3a are formed simultaneously together with the movable portions when the movable portions are formed by etching. In FIG. 1, the convexity 2c of the movable electrode 2 provides to widen the width of the movable electrode in the X direction. The convexity 3a of the massive portion 3 provides to widen the width of the massive portion 3 in the Y direction. The massive portion 3 includes multiple openings so that the convexity 3a protrudes to the opening. The convexity 2c protrudes from the movable electrode 2 by a predetermined amount, which is smaller than a distance between the movable and fixed electrodes 1, 2. For example, in a case where the minimum distance between the movable and fixed electrodes 1, 2 is 4 µm, the amount of the protrusion of the convexity 2c is set to be equal to or smaller than 1 µm. Preferably, the amount is set to be about 0.5 µm. Further, the convexity 3a protrudes to the opening of the massive portion 3 by a predetermined amount, which is smaller than a width of the opening in the Y direction. For example, in a case where the opening of the massive portion 3 has a width of 4 µm in the Y direction, the amount of the protrusion of the convexity 3a is set to be equal to or smaller than 1 µm. Preferably, the amount is set to be about 0.5 µm.

Figure 3A:
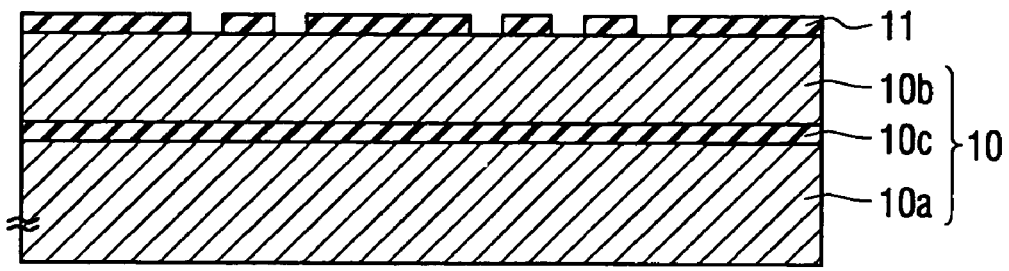
FIGS. 3A to 3C are cross sectional views explaining a manufacturing method of the sensor according to the preferred embodiment.
Figure 3B:
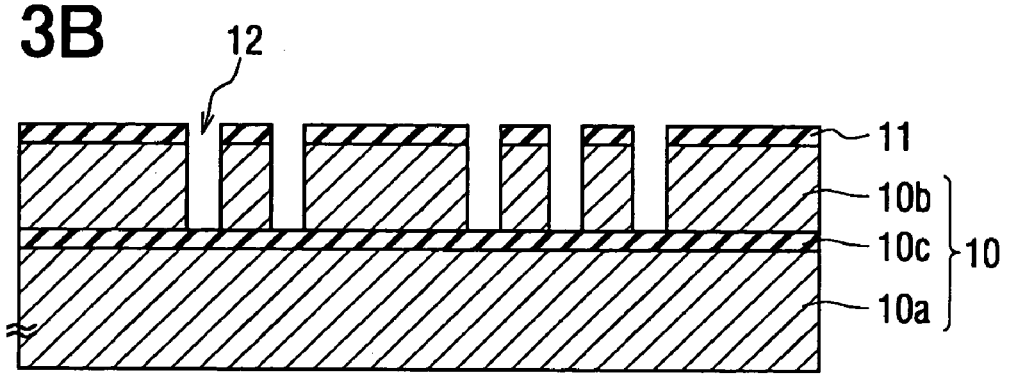
Figure 3C:
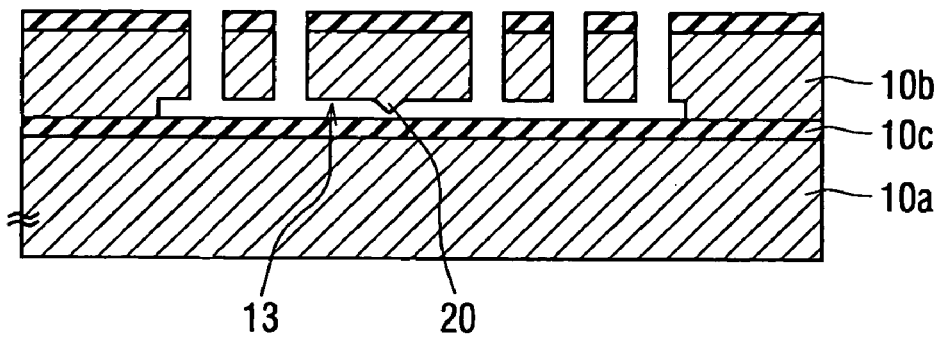

Next, a manufacturing process of the protrusion 20 is described as follows. FIGS. 3A–3C explains the manufacturing process. As shown in FIG. 3A, the substrate 10 includes the first silicon substrate 10a, an oxide film 10c and the second silicon substrate 10b. The oxide film 10c is disposed between the first and second silicon substrates 10a, 10b. At first, a photo resist 11 is applied to the second silicon substrate 10b. The photo resist 11 has a predetermined pattern corresponding to the movable portions. As shown in FIG. 3B, the second silicon substrate 10b is etched by an inductively coupled plasma (i.e., ICP) etching method so that the second silicon substrate 10b is etched anisotropically. Thus, a vertical groove 12 is formed in the second silicon substrate 10b. The vertical groove 12 has no undercut portion. Therefore, side surfaces of the movable portions such as the movable electrode 2, the massive portion 3 and the spring 4 are formed.

Then, the second silicon substrate 10b is etched isotropically so that a gap 13 between the movable portions and the oxide film 10c is formed. Specifically, part of the second silicon substrate 10b, which is disposed under a movable-electrode-to-be-formed region, a massive-portion-to-be-formed region and a spring-to-be-formed region, is removed so that the movable electrode 2, the massive portion 3 and the spring 4 are formed. Specifically, part of the second silicon substrate 10b disposed between the movable portions and the oxide film 10c is removed by isotropic etching, i.e., release etching for separating the movable portions from the oxide film 10c. At that time, a region having wide line width, which corresponds to the convexities 2a, 3a, takes long etching time, so that the etching time for etching the region completely becomes longer than other regions having comparatively narrow line width. Therefore, the region having the wide line width is not etched completely in case of short etching time so that the part of the second silicon substrate 10b disposed under the region remains without etching. Therefore, the remaining second silicon substrate 10b is controlled by the etching time so that the protrusion 20 is formed on the bottom of the movable portions. Thus, the protrusion 20 can be formed without adding an additional process for forming the protrusion 20. Further, the convexities 2a, 3a are simultaneously formed so that the movable electrode 2 is prevented from adhering to the fixed electrode 1 in the X direction. Specifically, the convexity 2a can prevent the movable electrode 2 from adhering to the fixed electrode 1 since the minimum distance between the fixed and movable electrodes 1, 2 in the X direction becomes small by forming the convexity 2a disposed on the protrusion 20.

(Modifications)

Figure 4:
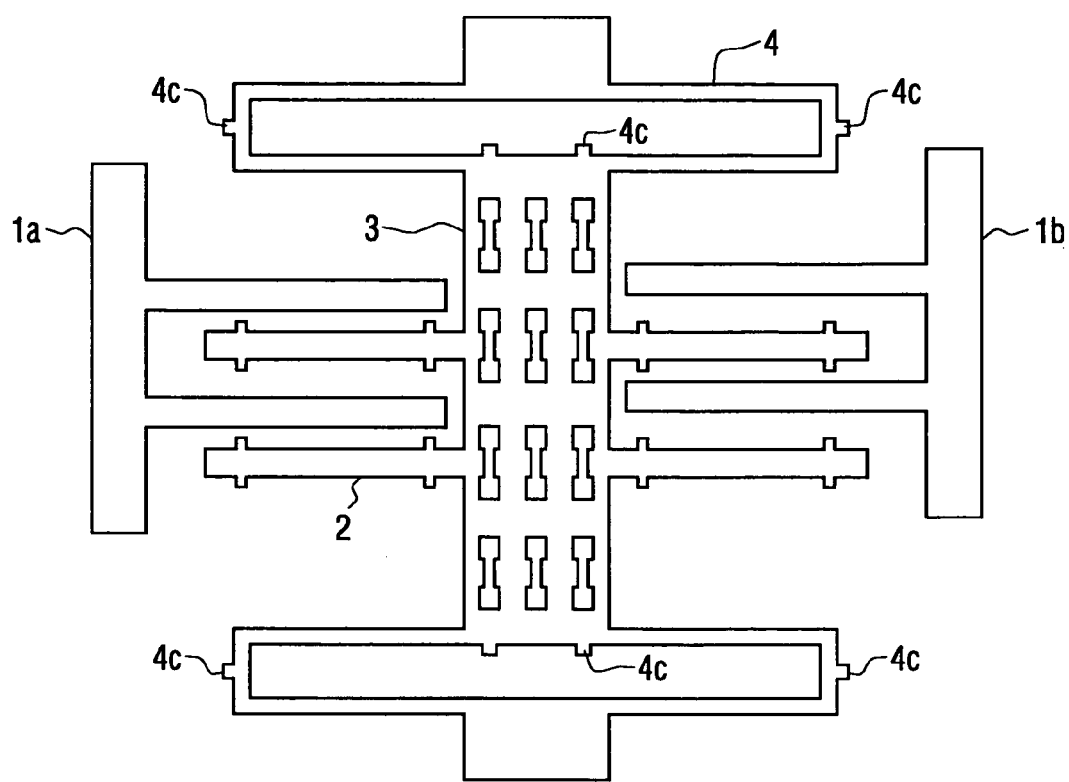
FIG. 4 is a plan view showing another physical quantity sensor, according to a modification of the preferred embodiment.

Although the sensor 100 includes the protrusion 20 disposed under the movable electrode 2 and the massive portion 3, the sensor 100 can include the protrusion 20 disposed under the spring 4, as shown in FIG. 4. In this case, the spring 4 has a convexity 4c for forming the protrusion 20 disposed on the bottom of the convexity 4c. The convexity 4c protrudes from the spring 4 about 1 μm. In FIG. 4, the convexity 4c of the spring 4 protrudes into the loop of the beams. Further, the convexity 4c protrudes to an outside of the ioop. Specifically, the convexity 4c protrudes from the side of the loop, and protrudes from the center of the beam. Thus, the spring 4 is prevented from adhering to the substrate 10. Further, the convexities 4c prevent the beams from adhering to each other.

Although the physical quantity sensor 100 is the acceleration sensor, the sensor can be an angular velocity sensor (i.e., angular rate sensor) or an angular acceleration sensor.

Such changes and modifications are to be understood as being within the scope of the present invention as defined by the appended claims.

What is claimed is:

1. A physical quantity sensor for detecting a physical quantity, the sensor comprising:
    a movable portion having a bottom; and
    a protrusion disposed on the bottom of the movable portion;
    a fixed electrode; and
    a substrate for supporting the movable portion movably,
    wherein the movable portion includes a movable electrode, which faces the fixed electrode in a horizontal direction so that the movable electrode is separated from the fixed electrode by a predetermined distance,
    wherein the protrusion is provided by a remaining portion, which remains without being etched when the movable portion is prepared by etching,
    wherein the movable portion is disposed over the substrate with a predetermined clearance therebetween,
    wherein the protrusion protrudes toward the substrate so that the protrusion prevents the movable portion from adhering to the substrate,
    wherein the movable portion includes a part, which has a large width compared with other parts of the movable portion, so that the part protrudes from the other parts toward the fixed electrode,
    wherein the part prevents the movable electrode from adhering to the fixed electrode,
    wherein the protrusion is disposed on the bottom of the part, and
    wherein the protrusion is formed simultaneously together with the movable portion in a case where the movable portion is removed from the substrate by etching.

2. The sensor according to claim 1, wherein the part of the movable portion remains in a case where the movable portion is formed by isotropically etching so that the protrusion is provided by a remaining portion of the part of the movable portion.

3. The sensor according to claim 1,
    wherein the movable electrode faces the fixed electrode so that a capacitor having a capacitance is provided between the movable and fixed electrodes, and
    wherein the physical quantity is detectable on the basis of the capacitance.

4. The sensor according to claim 1, wherein the movable portion includes a spring,
    wherein the spring is movable in accordance with an acceleration applied to the sensor, and
    wherein the protrusion protrudes from the spring.

5. The sensor according to claim 4,
    wherein the sensor is an acceleration sensor or an angular rate sensor.

6. The sensor according to claim 1, wherein the part of the movable portion is provided by a convexity extending to a movable direction of the movable portion.

7. The sensor according to claim 1,
    wherein the convexity protrudes from the movable electrode toward the fixed electrode for preventing the movable electrode from adhering to the fixed electrode.

* * * * *